(12) United States Patent
Tetelbaum (10) Patent No.: US 6,532,572 B1
(45) Date of Patent: Mar. 11, 2003

(54) METHOD FOR ESTIMATING POROSITY OF HARDMACS

(75) Inventor: Alexander Tetelbaum, Hayward, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 09/808,510

(22) Filed: Mar. 14, 2001

(51) Int. Cl.[7] ............................................... G06F 17/50

(52) U.S. Cl. ................................. 716/4; 716/5; 716/8

(58) Field of Search ..................................... 716/4, 5, 8

(56) References Cited

U.S. PATENT DOCUMENTS 5,835,378 A * 11/1998 Scepanovic et al. ........ 700/103

* cited by examiner

Primary Examiner—Tom Thomas
Assistant Examiner—Thien F Tran
(74) Attorney, Agent, or Firm—Fitch, Even, Tabin & Flannery (57) ABSTRACT

A method of estimating the number of available transit connections, or porosity, of a hardmac for a logic design routing tool includes the steps of calculating a total metal layer capacity of a hardmac, calculating an absolute porosity of the hardmac from the total metal layer capacity and an internal connection density, and calculating a relative porosity of the hardmac from the total metal layer capacity and the absolute porosity.

27 Claims, 5 Drawing Sheets

METHOD FOR ESTIMATING POROSITY OF HARDMACS

BACKGROUND OF THE INVENTION

The present invention relates generally to design tools for integrated circuits. More specifically, but without limitation thereto, the present invention relates to a method for estimating the number of transit connections that may be routed through a hardmac of an integrated circuit.

Integrated circuits typically include blocks or partitions of multiple circuit elements called hard macros or "hardmacs". Each hardmac is a generally rectangular cell that may be a complex hierarchical module containing several smaller modules. Connections made between hardmacs that pass through an intervening hardmac are called transit connections. The number of available transit connections, i.e., the total number of connections of a hardmac minus those connections used internally by the hardmac is termed the porosity of the hardmac. The porosity of each hardmac in an integrated circuit chip design is useful information for logic design tools in designing routable floorplans. Disadvantageously, porosity information is generally not available from hardmac cell libraries, and is generally costly to generate.

SUMMARY OF THE INVENTION

The present invention advantageously addresses the problems above as well as other problems by providing a method of estimating the number of available transit connections, or porosity, of a hardmac for a logic design routing tool.

In one embodiment, the present invention may be characterized as a method of estimating horizontal and vertical porosity of a hardmac that includes the steps of (a) calculating a total metal layer capacity of the hardmac, (b) calculating an absolute porosity of the hardmac from the total metal layer capacity and an internal connection density, and (c) calculating a relative porosity of the hardmac from the total metal layer capacity and the absolute porosity.

In another embodiment, the present invention may be characterized as a computer program product for estimating the porosity of a hardmac that includes a medium for embodying a computer program for input to a computer and a computer program embodied in the medium for causing the computer to perform the following functions:

(a) calculating a total horizontal metal layer capacity of a hardmac;

(b) calculating an absolute horizontal porosity of the hardmac from the total horizontal metal layer capacity and a horizontal internal connection density;

(c) calculating a relative horizontal porosity of the hardmac from the total horizontal metal layer capacity and the absolute horizontal porosity;

(d) calculating a total vertical metal layer capacity of the hardmac;

(e) calculating an absolute vertical porosity of the hardmac from the total vertical metal layer capacity and a vertical internal connection density; and (f) calculating a relative vertical porosity of the hardmac from the total vertical metal layer capacity and the absolute vertical porosity.

BRIEF DESCRIPTION OF THE DRAWINGS

The above and other aspects, features and advantages of the present invention will be more apparent from the following more specific description thereof, presented in conjunction with the following drawings wherein:

FIGS. 8A, 8B, and 8C illustrate a flowchart of a method for estimating horizontal and vertical porosity of a hardmac according to an embodiment of the present invention.

Corresponding reference characters indicate corresponding elements throughout the several views of the drawings.

DETAILED DESCRIPTION OF THE DRAWINGS

The following description is presented to disclose the currently known best mode for making and using the present invention. The scope of the invention is defined by the claims.

A logic design tool called a floorplanning tool is used to lay out an arrangement of circuit modules, or hardmacs, that are connected together to constitute an integrated circuit chip.

Figure 1:
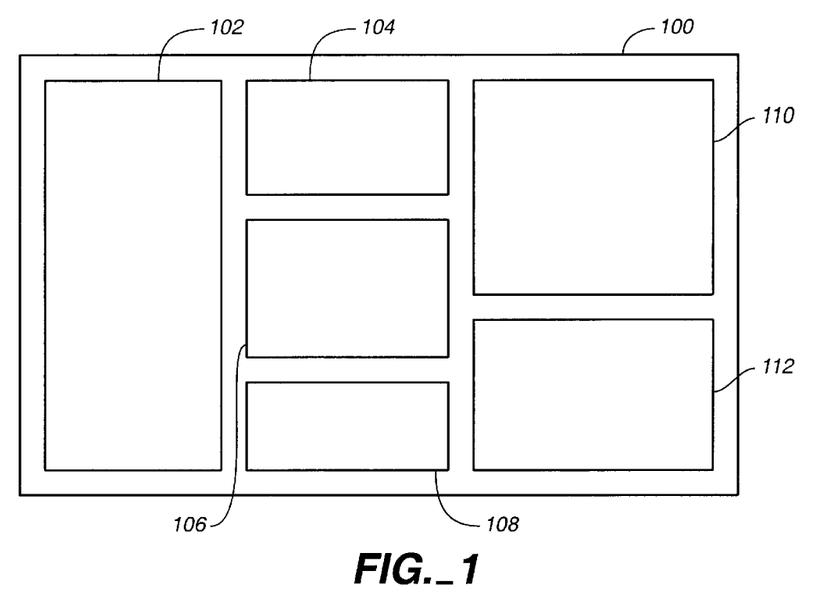
FIG. 1 is a diagram of a hardmac floorplan for estimating hardmac porosity according to an embodiment of the present invention.

FIG. 1 is a diagram of a hardmac floorplan 100 for estimating hardmac porosity. Shown in FIG. 1 are hardmacs 102, 104, 106, 108, 110, and 112. Each of the hardmacs 102, 104, 106, 108, 110, and 112 may be a complex hierarchical module of smaller circuit modules.

Figure 2:
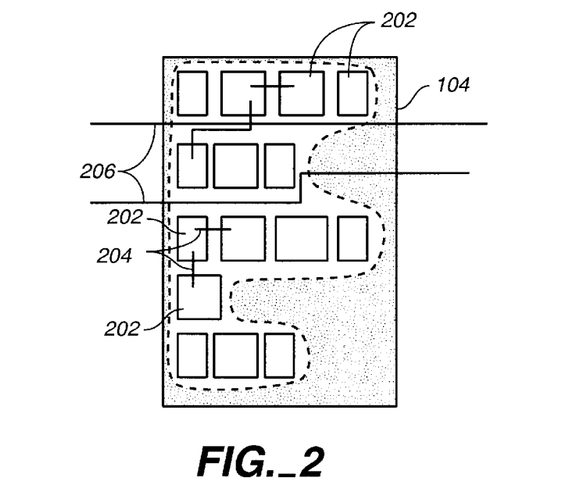
FIG. 2 is a diagram of a hardmac of FIG. 1 illustrating internal connections and transit connections.

FIG. 2 is a diagram illustrating internal connections and horizontal transit connections of the hardmac 104 in FIG. 1. Shown in FIG. 2 are the hardmac 104, cells 202, internal connections 204, and transit connections 206.

The hardmac 104 is a generally rectangular arrangement containing the cells 202. The cells 202 are connected to one another by the internal connections 204. In most hardmac designs, some space for making connections is left available and may be used for making the transit connections 206. The transit connections 206 cross the hardmac 104 for making connections between hardmacs on either side of the hardmac 104 that are not directly related to the internal connections 204 of the hardmac 104.

The number of available transit connections 206 of the hardmac 104 that are not used internally by the hardmac 104 is termed the porosity of the hardmac 104. The porosity of each hardmac in an integrated circuit chip design is useful information for logic design tools that design routable floorplans. However, manually analyzing each hardmac to calculate the number of available transit connections is too time-consuming for a practical product development cycle.

Figure 3:
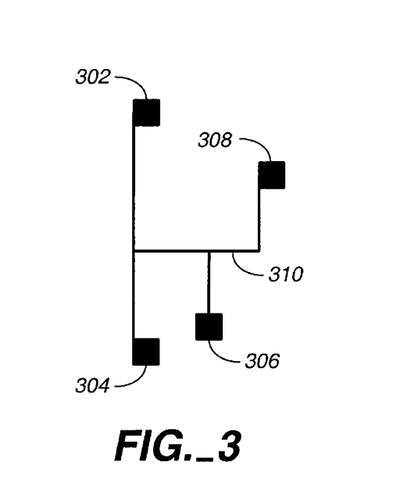
FIG. 3 is a diagram of a connection tree of the hardmac of FIG. 2.

FIG. 3 is a diagram of a connection tree of the hardmac 104 of FIG. 2. Shown in FIG. 3 are pins 302, 304, 306, and 308, and a net 310. In general, the net is 310 is the shortest connection tree that can connect the pins 302, 304, 306, and 308. The net 310 is generated by a logic design routing tool in a netlist according to well known techniques that includes information about the coordinates of each pin so that the lengths of all internal connections from one pin to another and the number of internal connections along horizontal and vertical grids required between cells may be calculated.

The total metal layer capacity for transit connections in the horizontal direction may be defined as the total number of available horizontal grids in metal layers used for routing horizontal connections and may be calculated from the formula:

$$TMLC_H = \sum_{HORIZONTAL\ ROUTING\ LAYER} \frac{L}{G_{HORIZONTAL\ ROUTING\ LAYER}} \quad (1)$$

where $G_{HORIZONTAL\ ROUTING\ LAYER}$ is the grid pitch of each horizontal routing layer and L is the length of each horizontal routing layer.

Figure 4:
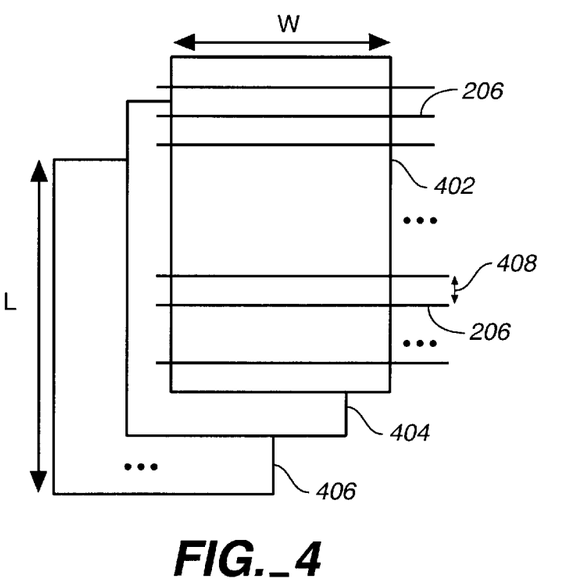
FIG. 4 is a diagram of horizontal metal layers in the hardmac of FIG. 2.

FIG. 4 is diagram of horizontal routing layers in the hardmac of FIG. 2. Shown in FIG. 4 are horizontal routing layers 402, 404, and 406, transit connections 206, and horizontal grid pitch 408.

The number of available transit connections 206 in each of the horizontal routing layers 402, 404, and 406 may be calculated from the formula:

$$PH = K \cdot (TMLC_H - IRH) \quad (2)$$

where PH is the absolute horizontal porosity, K is an empirical coefficient corresponding to internal connection density, and IRH is the maximum number of horizontal internal connections crossing a vertical zone of the hardmac 104 as calculated from the netlist. The zone crossed by the maximum number of internal connections is called a critical zone.

The relative horizontal porosity of the hardmac 104 is then given by:

$$PRH = \frac{PH \cdot 100\%}{TMLC_H} \quad (3)$$

The maximum number of horizontal internal connections crossing a critical zone of the hardmac 104 may be estimated by dividing each of the horizontal routing layers 402, 404, and 406 into N vertical zones.

Figure 5:
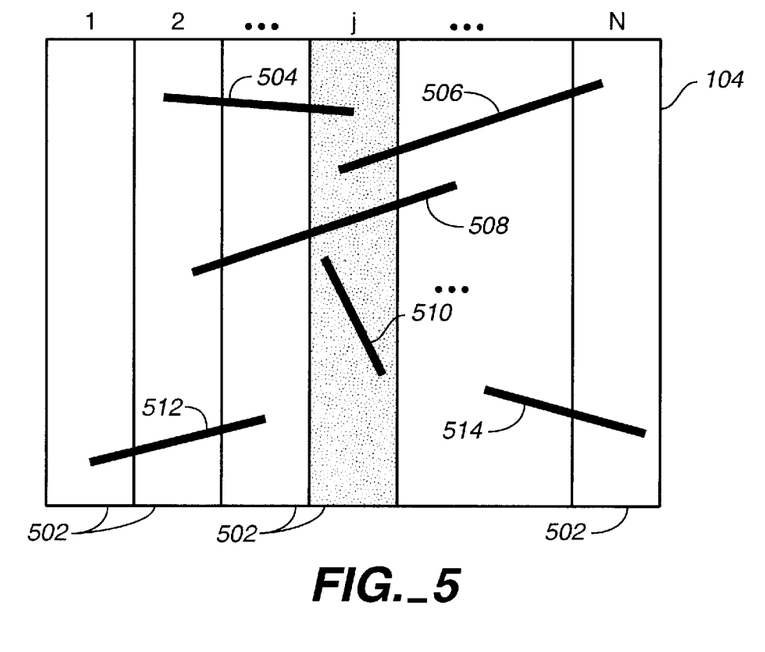
FIG. 5 is a diagram of vertical zones within a vertical metal layer of FIG. 4.

FIG. 5 is a diagram of vertical zones within a horizontal routing layer of FIG. 4. Shown in FIG. 5 are the hardmac 104, N vertical zones 502, and internal connections 504, 506, 508, 510, 512, and 514. Each vertical zone has a number of horizontal grids shown as the transit connections 206 in FIG. 4 that are used for routing connections within the metal layer.

The different relationships illustrated in FIG. 5 between an internal connection and a vertical zone j determine how many horizontal grids are required in the vertical zone j for each internal connection. The internal connections 512 and 514 begin and end outside the vertical zone j, therefore the internal connections 512 and 514 do not require any horizontal grids in the vertical zone j. The internal connection 508 crosses the vertical zone j, therefore at least one horizontal grid within the vertical zone j is required for the internal connection 508. The internal connection 510 begins and ends within the vertical zone j, therefore the internal connection 510 may require up to two horizontal grids. For example, if the end points of the internal connection 510 have the same X-coordinate, then the end points may be connected by a vertical wire of a vertical layer, therefore no horizontal grids are required. If the end points of the internal connection 510 have different X-coordinates and the same Y-coordinate, then the end points may be connected by a horizontal wire, therefore one horizontal grid is required. If the end points of the internal connection 510 have different X-coordinates and different Y-coordinates, then at least one and possibly two horizontal wires are required to connect the end points to a vertical wire of a vertical layer, therefore one or two horizontal grids are required. The internal connections 504 and 506 either begin or end within the vertical zone j, therefore the internal connections 504 and 506 may require up to one horizontal grid in the vertical zone j. The critical zone is defined as the vertical zone j that uses the maximum number of grids IRH for internal connections.

In a manner similar to that described above, the total metal layer capacity for transit connections in the vertical direction may be defined as the total number of available vertical grids in metal layers used for routing vertical connections:

$$TMLC_V = \sum_{VERTICAL\ ROUTING\ LAYER} \frac{W}{G_{VERTICAL\ ROUTING\ LAYER}} - PS \quad (4)$$

where $G_{VERTICAL\ ROUTING\ LAYER}$ is the grid pitch of each vertical routing layer, W is the width of each vertical routing layer, and PS is the number of vertical grids occupied by power rails, typically 2 power rails in each cell.

Figure 6:
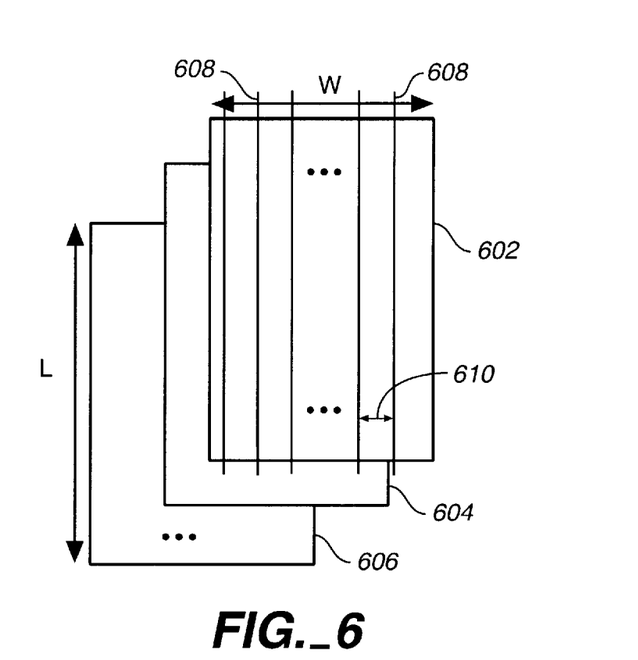
FIG. 6 is a diagram of vertical metal layers in the hardmac of FIG. 2.

FIG. 6 is diagram of vertical routing layers in the hardmac of FIG. 2. Shown in FIG. 6 are vertical routing layers 602, 604, and 606, transit connections 608, and vertical grid pitch 610.

The number of available transit connections 608 in each of the vertical routing layers 602, 604, and 606 may be calculated from the formula:

$$PV = K \cdot (TMLC_V - IRV) \quad (5)$$

where PV is the absolute vertical porosity, K is the empirical coefficient corresponding to internal connection density, and IRV is the maximum number of vertical internal connections crossing a critical zone of th e hardmac 104 as calculated from the netlist.

The relative vertical porosity of the hardmac 104 is then given by:

$$PRV = \frac{PV \cdot 100\%}{TMLC_V} \quad (6)$$

The maximum number of vertical internal connections crossing a critical zone of the hardmac 104 may be estimated by dividing each of the vertical routing layers 602, 604, and 606 into M horizontal zones. Each horizontal zone has a number of vertical grids used for routing connections within the metal layer.

Figure 7:
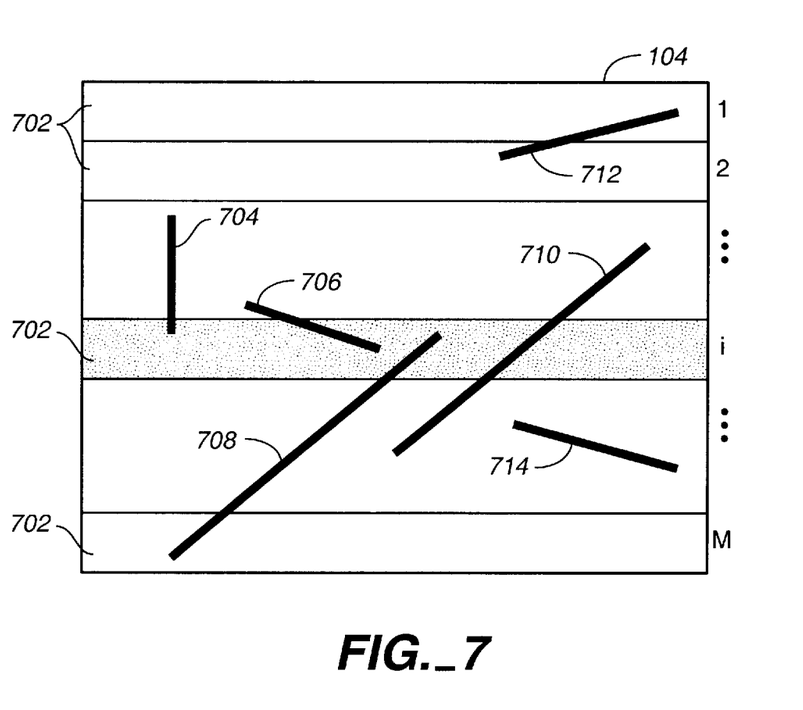
FIG. 7 is a diagram of horizontal zones within a vertical metal layer of FIG. 6.

FIG. 7 is a diagram of horizontal zones within a vertical routing layer of FIG. 6. Shown in FIG. 7 are a hardmac 104, M horizontal zones 702, and internal connections 704, 706, 708, 710, 712, and 714.

The different relationships illustrated in FIG. 7 between an internal connection and a horizontal zone i determine how many vertical grids are required in the horizontal zone i for each internal connection. The internal connections 712 and 714 begin and end outside the horizontal zone i, therefore the internal connections 712 and 714 do not require any vertical grids in the horizontal zone i. The internal connection 710 crosses the horizontal zone i, therefore at least one vertical grid within the horizontal zone i is required for the internal connection 710. The internal connection 706 begins and ends within the horizontal zone i, therefore the internal connection 706 may require up to two vertical grids. For example, if the end points of the internal connection 706 have the same Y-coordinate, then the end points may be connected by a horizontal wire of a horizontal metal layer, therefore zero vertical grids are required. If the end points of the internal connection 706 have different Y-coordinates and the same X-coordinate, then the end points may be connected by a vertical wire, therefore one vertical grid is required. If the end points of the internal connection 706 have different Y-coordinates and different X-coordinates, then at least one and possibly two vertical wires may be required to connect the end points to a horizontal wire of a horizontal metal layer, therefore one or two vertical grids are required. The internal connections 704 and 708 either begin or end within the horizontal zone i, therefore the internal connections 704 and 708 may require up to one vertical grid in the horizontal zone i. The critical zone is defined as the horizontal zone i that uses the maximum number of grids IRV for internal connections.

The empirical coefficient K used in formulas (2) and (5) may be calculated from the formula:

$$K = 0.5 \left( \frac{TMLC_H - IRH_{AVE}}{TMLC_H} - \frac{TMLC_V - IRV_{AVE}}{TMLC_V} \right) \quad (7)$$

where $TMLC_H$ is the total metal layer capacity for horizontal routing layers, $TNLC_V$ is the total metal layer capacity for vertical routing layers, $IRH_{AVE}$ is the average number of internal connections that cross vertical zones in the horizontal routing layers, and $IRV_{AVE}$ is the average number of internal connections that cross horizontal zones in the vertical routing layers. $IRH_{AVE}$ and $IRV_{AVE}$ may be readily calculated from the netlist according to well known techniques. The calculated value of K may then be substituted into formulas (2) and (5).

In summary, a method of estimating the porosity of a hardmac includes the steps of calculating a total metal layer capacity of a hardmac, calculating an absolute porosity of the hardmac from the total metal layer capacity and an internal connection density, and calculating a relative porosity of the hardmac from the total metal layer capacity and the absolute porosity.

Figure 8A:
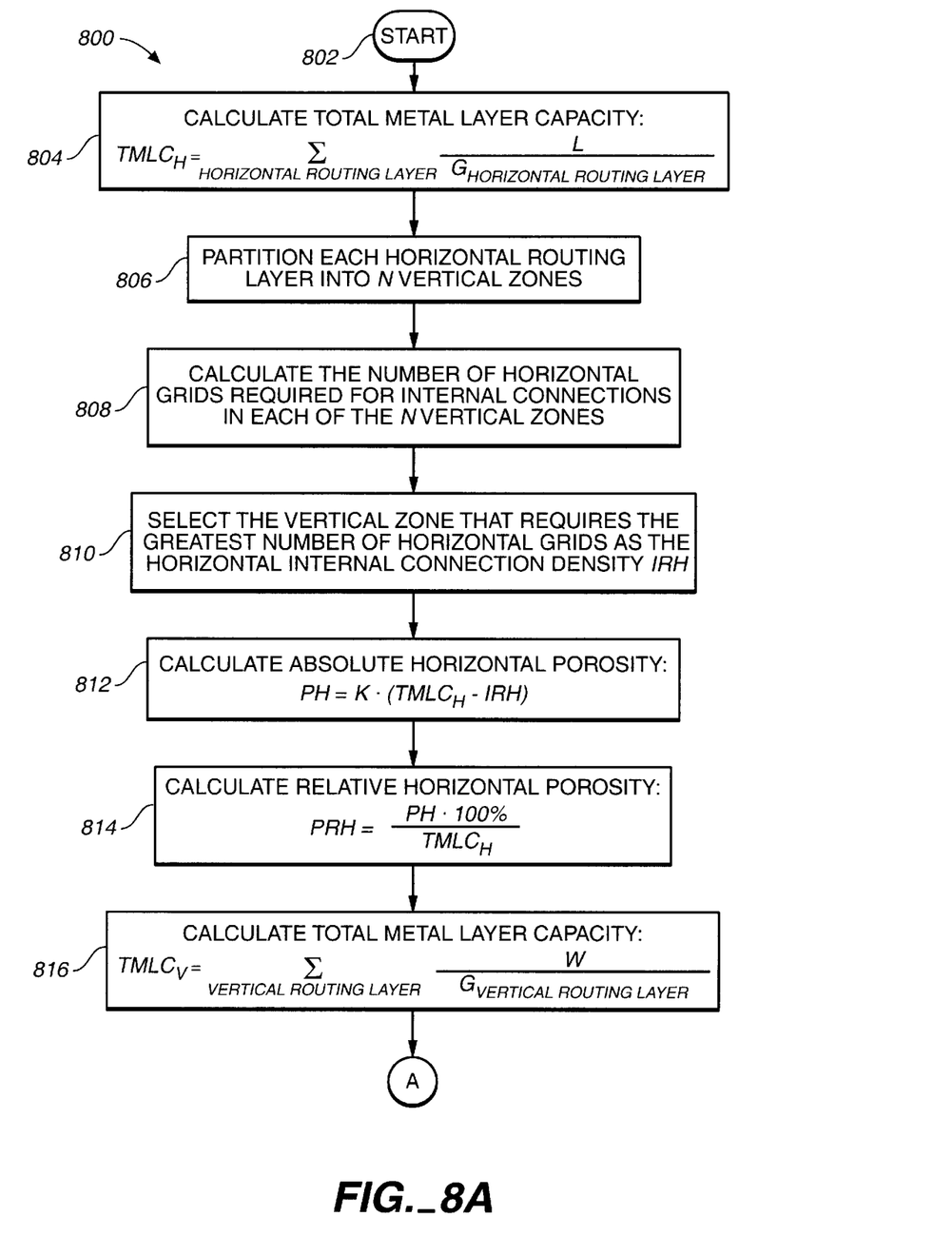
Figure 8B:
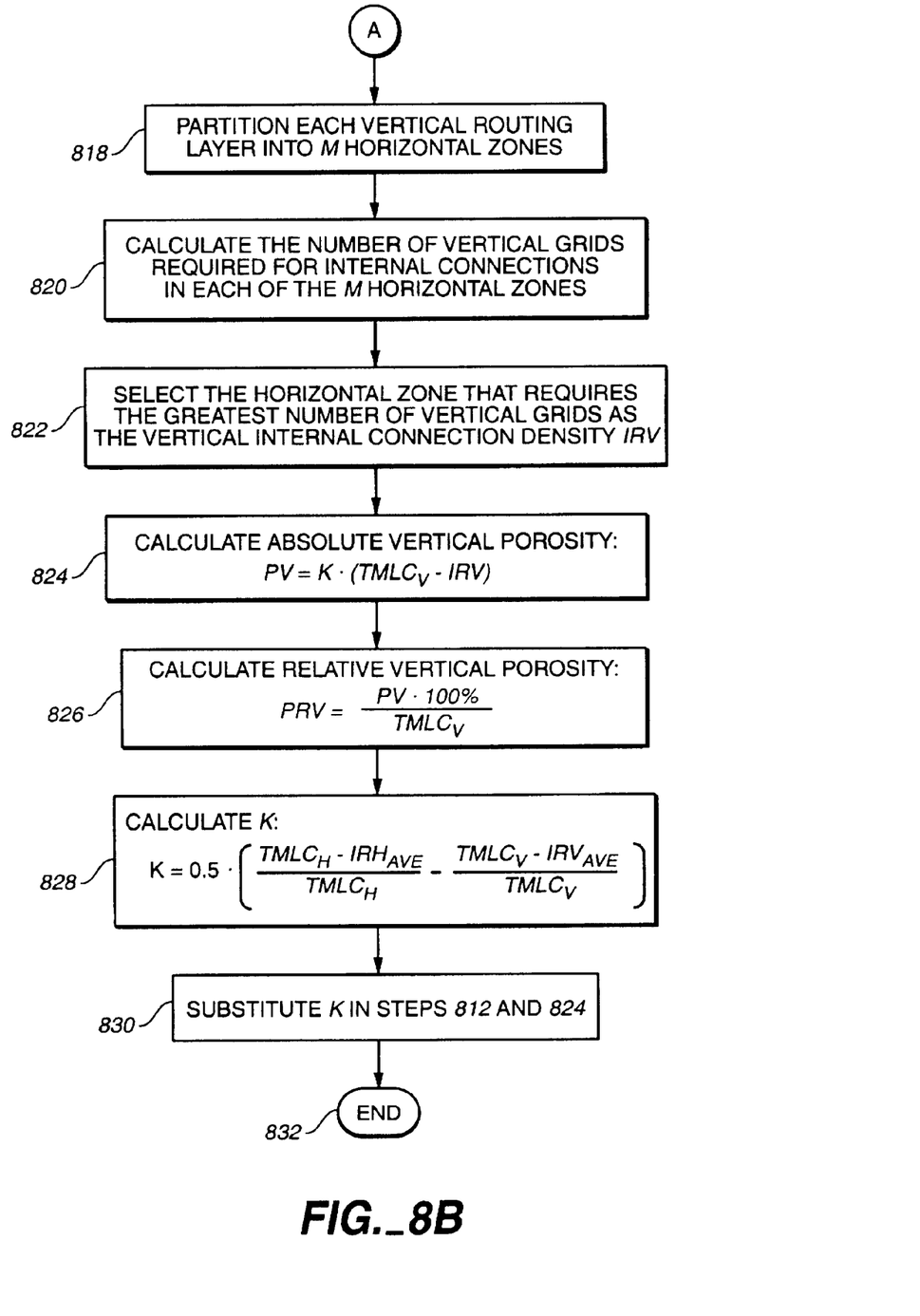

FIGS. 8A, 8B, and 8C illustrate a flowchart 800 of a method for estimating horizontal and vertical porosity according to an embodiment of the present invention.

Step 802 is the entry point for the flowchart 800.

In step 804, a total metal layer capacity is calculated from each horizontal routing layer of a hardmac according to the formula:

$$TMLC_H = \sum_{HORIZONTAL\ ROUTING\ LAYER} \frac{L}{G_{HORIZONTAL\ ROUTING\ LAYER}}$$

In step 806, each horizontal routing layer is partitioned into N vertical zones. Each vertical zone has a number of horizontal grids used for routing connections within the metal layer.

In step 808, the number of horizontal grids required for internal connections in each of the N vertical zones is calculated from a netlist of the hardmac.

In step 810, the vertical zone that requires the greatest number of horizontal grids is calculated as the horizontal internal connection density IRH.

In step 812, the absolute horizontal porosity of the hardmac is calculated from the total horizontal metal layer capacity and the horizontal internal connection density according to the formula:

$$PH=K \cdot (TMLC_H-IRH)$$

In step 814, a relative horizontal porosity is calculated from the total horizontal metal layer capacity and the absolute horizontal porosity according to the formula:

$$PRH = \frac{PH \cdot 100\%}{TMLC_H}$$

In step 816, a total metal layer capacity is calculated from each vertical routing layer of the hardmac according to the formula:

$$TMLC_V = \sum_{VERTICAL\ ROUTING\ LAYER} \frac{W}{G_{VERTICAL\ ROUTING\ LAYER}} - PS$$

In step 818, each vertical routing layer is partitioned into N horizontal zones. Each horizontal zone has a number of vertical grids used for routing connections within the metal layer.

In step 820, the number of vertical grids required for internal connections in each of the M horizontal zones is calculated from the netlist.

In step 822, the horizontal zone that requires the greatest number of vertical grids is calculated as the vertical internal connection density IRV.

In step 824, an absolute vertical porosity of the hardmac is calculated from the total vertical metal layer capacity and the vertical internal connection density according to the formula:

$$PV=K \cdot (TMLC_V-IRV)$$

In step 826, a relative vertical porosity is calculated from the total vertical metal layer capacity and the absolute vertical porosity according to the formula:

$$PRV = \frac{PV \cdot 100\%}{TMLC_V}$$

In step 828, the empirical coefficient K is calculated according to the formula:

$$K = 0.5 \cdot \left( \frac{TMLC_H - IRH_{AVE}}{TMLC_H} - \frac{TMLC_V - IRV_{AVE}}{TMLC_V} \right)$$

In step 830, the calculated value of K is substituted into the formulas of steps 812 and 824.

Step 832 is the exit point for the flowchart 800.

The flowchart 800 above for estimating the porosity of a hardmac may be embodied in a computer program product and implemented by a computer according to well known programming techniques to perform the following functions: (a) calculating a metal layer capacity of each metal layer of a hardmac to generate a total metal layer capacity; (b) calculating an absolute porosity of the hardmac from the total metal layer capacity and an internal connection density; and (c) calculating a relative porosity from the total metal layer capacity and the absolute porosity.

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. A method of estimating porosity of a hardmac comprising the steps of:
   (a) calculating a total metal layer capacity of a hardmac;
   (b) calculating an absolute porosity of the hardmac from the total metal layer capacity and an internal connection density; and
   (c) calculating a relative porosity of the hardmac from the total metal layer capacity and the absolute porosity.

2. The method of claim 1 wherein each metal layer is a horizontal routing layer.

3. The method of claim 2 wherein the total metal layer capacity of the hardmac is calculated from each horizontal routing layer in step (a) substantially from the following formula:

$$TMLC = \sum_{ROUTING\ LAYER} \frac{L}{G_{ROUTING\ LAYER}}$$

wherein TMLC is the total metal layer capacity, L is a length of the hardmac, and $G_{ROUTING\ LAYER}$ is a horizontal grid pitch.

4. The method of claim 3 wherein an absolute horizontal porosity of the hardmac is calculated in step (b) substantially from the following formula:

$$PH = K \cdot (TMLC - IRH)$$

wherein PH is the absolute horizontal porosity, K is a coefficient corresponding to average internal routing density, and IRH is a horizontal internal connection density.

5. The method of claim 4 wherein step (b) includes calculating the horizontal internal connection density by the steps of:
   (1) partitioning each horizontal routing layer into N vertical zones;
   (2) calculating the number of horizontal grids required for internal connections in each of the N vertical zones; and
   (3) selecting one of the N vertical zones that requires the greatest number of horizontal grids as the horizontal internal connection density.

6. The method of claim 3 wherein a relative horizontal porosity of the hardmac is calculated in step (c) from the following formula:

$$PRH = \frac{PH \cdot 100\%}{TMLC_H}$$

wherein PRH is the relative horizontal porosity of the hardmac.

7. The method of claim 1 wherein each metal layer is a vertical routing layer.

8. The method of claim 7 wherein the total metal layer capacity of the hardmac is calculated from each vertical routing layer in step (a) substantially from the following formula:

$$TMLC = \sum_{ROUTING\ LAYER} \frac{W}{G_{ROUTING\ LAYER}}$$

wherein TMLC is the total metal layer capacity, W is a width of the hardmac, and $G_{ROUTING\ LAYER}$ is a vertical grid pitch.

9. The method of claim 8 wherein an absolute vertical porosity of the hardmac is calculated in step (b) substantially from the following formula:

$$PV = K \cdot (TMLC - IRV)$$

wherein PV is the absolute vertical porosity, K is a coefficient corresponding to average internal routing density, and IRV is a vertical internal connection density.

10. The method of claim 9 wherein step (b) includes calculating the vertical internal connection density by the steps of:
    (1) partitioning each vertical routing layer into M horizontal zones;
    (2) calculating the number of vertical grids required for internal connections in each of the M horizontal zones; and
    (3) selecting one of the N horizontal zones that requires the greatest number of vertical grids as the vertical internal connection density.

11. The method of claim 9 wherein a relative vertical porosity of the hardmac is calculated in step (c) substantially from the following formula:

$$PRV = \frac{PV \cdot 100\%}{TMLC}$$

wherein PRV is the relative vertical porosity of the hardmac.

12. The method of claim 9 wherein K is calculated substantially from the following formula:

$$K = 0.5 \cdot \left( \frac{TMLC_H - IRH_{AVE}}{TMLC_H} - \frac{TMLC_V - IRV_{AVE}}{TMLC_V} \right)$$

wherein $TMLC_H$ is a total metal layer capacity for horizontal routing metal layers, $TMLC_V$ is a total metal layer capacity for vertical routing layers, $IRH_{AVE}$ is an average number of internal connections that cross vertical zones in the horizontal routing layers, and $IRV_{AVE}$ is an average number of internal connections that cross horizontal zones in the vertical routing layers.

13. A computer program product for estimating porosity of a hardmac comprising:
    a medium for embodying a computer program for input to a computer; and
    a computer program embodied in the medium for causing the computer to perform the following functions:
       (a) calculating a total metal layer capacity of a hardmac;
       (b) calculating an absolute porosity of the hardmac from the total metal layer capacity and an internal connection density; and
       (c) calculating a relative porosity of the hardmac from the total metal layer capacity and the absolute porosity.

14. The computer program product of claim 13 wherein each metal layer is a horizontal routing layer.

15. The computer program product of claim 14 wherein the total metal layer capacity of the hardmac is calculated from each horizontal routing layer in step (a) substantially from the following formula:

$$TMLC = \sum_{ROUTING\ LAYER} \frac{L}{G_{ROUTING\ LAYER}}$$

wherein TMLC is the total metal layer capacity, L is a length of the hardmac, and $G_{ROUTING\ LAYER}$ is a horizontal grid pitch.

16. The computer program product of claim 15 wherein an absolute horizontal porosity of the hardmac is calculated in step (b) substantially from the following formula:

$$PH = K \cdot (TMLC - IRH)$$

wherein PH is the absolute horizontal porosity, K is a coefficient corresponding to average internal routing density, and IRH is a horizontal internal connection density.

17. The computer program product of claim 16 wherein step (b) includes calculating the horizontal internal connection density by the steps of:

(1) partitioning each horizontal routing layer into N vertical zones;

(2) calculating the number of horizontal grids required for internal connections in each of the N vertical zones; and (3) selecting one of the N vertical zones that requires the greatest number of horizontal grids as the horizontal internal connection density.

18. The computer program product of claim 16 wherein a relative horizontal porosity of the hardmac is calculated in step (c) substantially from the following formula:

$$PRH = \frac{PH \cdot 100\%}{TMLC}$$

wherein PRH is the relative horizontal porosity of the hardmac.

19. The computer program product of claim 13 wherein each metal layer is a vertical routing layer.

20. The computer program product of claim 19 wherein the total metal layer capacity of the hardmac is calculated from each vertical routing layer in step (a) substantially from the following formula:

$$TMLC = \sum_{ROUTING\ LAYER} \frac{W}{G_{ROUTING\ LAYER}}$$

wherein TMLC is the total metal layer capacity, W is a width of the hardmac, and $G_{ROUTING\ LAYER}$ is a vertical grid pitch.

21. The computer program product of claim 20 wherein an absolute vertical porosity of the hardmac is calculated in step (b) substantially from the following formula:

$$PV = K \cdot (TMLC - IRV)$$

wherein PV is the absolute vertical porosity, K is a coefficient corresponding to average internal routing density, and IRV is a vertical internal connection density.

22. The computer program product of claim 21 wherein step (b) includes calculating the vertical internal connection density by the steps of:

(1) partitioning each vertical routing layer into M horizontal zones;

(2) calculating the number of vertical grids required for internal connections in each of the M horizontal zones; and (3) selecting one of the M horizontal zones that requires the greatest number of vertical grids as the vertical internal connection density.

23. The computer program product of claim 21 wherein a relative vertical porosity of the hardmac is calculated in step (c) substantially from the following formula:

$$PRV = \frac{PV \cdot 100\%}{TMLC}$$

wherein PRV is the relative vertical porosity of the hardmac.

24. The computer program product of claim 21 wherein K is calculated substantially from the following formula:

$$K = 0.5 \cdot \left( \frac{TMLC_H - IRH_{AVE}}{TMLC_H} - \frac{TMLC_V - IRV_{AVE}}{TMLC_V} \right)$$

wherein $TMLC_H$ is a total metal layer capacity for horizontal routing layers, $TMLC_V$ is a total metal layer capacity for vertical routing layers, $IRH_{AVE}$ is an average number of internal connections that cross vertical zones in the horizontal routing layers, and $IRV_{AVE}$ is an average number of internal connections that cross horizontal zones in the vertical routing layers.

25. A computer program product for estimating porosity of a hardmac comprising:

a medium for embodying a computer program for input to a computer; and a computer program embodied in the medium for causing the computer to perform the following functions:

(a) calculating a total horizontal metal layer capacity of a hardmac;

(b) calculating a horizontal internal connection density;

(c) calculating an absolute horizontal porosity of the hardmac from the total horizontal metal layer capacity and the horizontal internal connection density;

(d) calculating a relative horizontal porosity of the hardmac from the total horizontal metal layer capacity and the absolute horizontal porosity;

(e) calculating a total vertical metal layer capacity of the hardmac;

(f) calculating a vertical internal connection density;

(g) calculating an absolute vertical porosity of the hardmac from the total vertical metal layer capacity and the vertical internal connection density; and (h) calculating a relative vertical porosity of the hardmac from the total vertical metal layer capacity and the absolute vertical porosity.

26. The computer program product of claim 25 wherein step (b) includes the steps of:

(1) partitioning each horizontal routing layer into N vertical zones;

(2) calculating the number of horizontal grids required for internal connections in each of the N vertical zones; and (3) selecting one of the N vertical zones that requires the greatest number of horizontal grids as the horizontal internal connection density.

27. The computer program product of claim 25 wherein step (f) includes the steps of:

(1) partitioning each vertical routing layer into M horizontal zones;

(2) calculating the number of vertical grids required for internal connections in each of the M horizontal zones; and (3) selecting one of the M horizontal zones that requires the greatest number of vertical grids as the vertical internal connection density.

* * * * *